US012690231B2

(12) United States Patent
Kinoshita

(10) Patent No.: US 12,690,231 B2
(45) Date of Patent: Jul. 21, 2026

(54) SEMICONDUCTOR DEVICE

(71) Applicant: FUJI ELECTRIC CO., LTD.,
Kawasaki (JP)

(72) Inventor: Akimasa Kinoshita, Matsumoto-city
(JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 428 days.

(21) Appl. No.: 18/521,509

(22) Filed: Nov. 28, 2023

(65) Prior Publication Data

US 2024/0097025 A1     Mar. 21, 2024

Related U.S. Application Data

(63) Continuation of application No.
PCT/JP2022/041462, filed on Nov. 7, 2022.

(30) Foreign Application Priority Data

Dec. 17, 2021     (JP) ................................. 2021-204861

(51) Int. Cl.
*H10D 30/66* (2025.01)
*H10D 62/10* (2025.01)
(Continued)

(52) U.S. Cl.
CPC ......... *H10D 30/668* (2025.01); *H10D 62/109*
(2025.01); *H10D 62/127* (2025.01); *H10D*
*62/153* (2025.01); *H10D 62/8325* (2025.01)

(58) Field of Classification Search
CPC .. H10D 30/668; H10D 62/109; H10D 62/127;
H10D 62/153; H10D 62/8325;
(Continued)

(56) References Cited

U.S. PATENT DOCUMENTS

| | | |
|---|---|---|
| 2015/0034974 A1 | 2/2015 | Nishio et al. |
| 2017/0005186 A1 | 1/2017 | Hirabayashi et al. |
| | (Continued) | |

FOREIGN PATENT DOCUMENTS

| | | |
|---|---|---|
| JP | 2012-191056 A | 10/2012 |
| JP | 2015-032674 A | 2/2015 |
| | (Continued) | |

OTHER PUBLICATIONS

The Extended European Search Report dated Sep. 20, 2024, in the
counterpart European Patent Application No. 22907078.4.
(Continued)

*Primary Examiner* — Mohammad A Rahman
(74) *Attorney, Agent, or Firm* — Rabin & Berdo. P.C.

(57)     ABSTRACT

$N^+$-type source regions, low-concentration regions, and $p^{++}$-type contact regions are each selectively provided in surface regions of a semiconductor substrate, at a front surface thereof, and are in contact with a source electrode. The $n^+$-type source regions and the low-concentration regions are in contact with a gate insulating film at sidewalls of a trench and are adjacent to channel portions of a p-type base region, in a depth direction. The $p^{++}$-type contact regions are disposed apart from the trench. In surface regions of an epitaxial layer constituting the p-type base region, portions left free of the $n^+$-type source regions and the $p^{++}$-type contact regions configure the low-concentration regions of an $n^-$-type or a $p^-$-type. The low-concentration regions are disposed periodically along the trench, between the trench and the $p^{++}$-type contact regions. By the described structure, short-circuit withstand capability may be increased without increasing the number of processes.

10 Claims, 7 Drawing Sheets

(51) Int. Cl.
    *H10D 62/13*        (2025.01)
    *H10D 62/832*      (2025.01)

(58) Field of Classification Search
    CPC .............. H10D 30/0297; H10D 30/662; H10D
              62/107; H10D 62/111; H10D 62/157;
                                     H10D 62/393
    See application file for complete search history.

(56) References Cited

U.S. PATENT DOCUMENTS

| 2018/0138274 | A1 | 5/2018 | Ohse et al. | |
|---|---|---|---|---|
| 2020/0035817 | A1 | 1/2020 | Tamura et al. | |
| 2020/0035825 | A1* | 1/2020 | Kyogoku ........... | H10D 30/0297 |
| 2020/0152748 | A1 | 5/2020 | Okumura | |
| 2021/0296435 | A1 | 9/2021 | Kumagai | |
| 2021/0384298 | A1 | 12/2021 | Hoshi | |
| 2021/0384343 | A1 | 12/2021 | Takeuchi et al. | |

FOREIGN PATENT DOCUMENTS

| JP | 2017-017222 | A | 1/2017 |
|---|---|---|---|
| JP | 2020-017640 | A | 1/2020 |
| JP | 2020-047782 | A | 3/2020 |
| JP | 2020-077800 | A | 5/2020 |
| JP | 2020-141130 | A | 9/2020 |
| JP | 6880669 | B2 | 6/2021 |
| WO | 2015/186428 | A1 | 12/2015 |
| WO | 2019/078131 | A1 | 4/2019 |

OTHER PUBLICATIONS

International Search Report for International Application No. PCT/JP2022/041462, issued on Jan. 24, 2023.
Written Opinion for International Application No. PCT/JP2022/041462, issued on Jan. 24, 2023.

* cited by examiner

SEMICONDUCTOR DEVICE

CROSS REFERENCE TO RELATED APPLICATIONS

This is a continuation application of International Application PCT/JP2022/041462 filed on Nov. 7, 2022 which claims priority from a Japanese Patent Application No. 2021-204861 filed on Dec. 17, 2021, the contents of which are incorporated herein by reference.

BACKGROUND OF THE INVENTION

1. Field of the Invention

Embodiments of the invention relate to a semiconductor device.

2. Description of the Related Art

Conventionally, metal oxide semiconductor field effect transistors (MOSFETs), which have an insulated gate with a metal oxide-film semiconductor three-layer structure, are optimally designed to have a small saturation current value to suppress short circuit current. Short circuit current is a drain-source current that flows during a load short-circuit or during an arm short-circuit and is a large current that exceeds the rated current. The saturation current value is the value of the saturation of the drain-source current dependent on and determined by the gate-source voltage.

Generally, in a portion of a p-type base region where a channel (n-type inversion layer) is formed, a $p^-$-type low-concentration region having a p-type impurity concentration that is lower than that of the p-type base region is disposed, thereby, facilitating the pinching-off of channels, whereby the time that elapses until the drain-source current is blocked decreases and a small saturation current value is set. Further, the saturation current value is set to be small, using the shape and impurity concentration gradient of an n-type junction FET (JFET) region formed adjacent to the channel, on a current path of drift current that flows between the drain and source during an on-state.

Use of the shape of the JFET region means suitably setting arrangement of $p^+$-type regions, which determine a width of the JFET region, so that the width (width of a portion of the current path of the drift current) of the JFET region becomes narrower. Use of the impurity concentration gradient of the JFET region means setting an n-type impurity concentration of the JFET region to be low with respect to the p-type impurity concentration of the channel. By optimally designing the JFET region, when voltage (forward voltage) that is positive with respect to a source electrode is applied to a drain electrode, depletion of the JFET region is facilitated, whereby the saturation current value becomes smaller.

A structure of a conventional MOSFET is described taking, as an example, a vertical MOSFET having a trench gate structure that contains silicon carbide (SiC) as a semiconductor material. FIG. 6 is a perspective view depicting a structure of a conventional semiconductor device. FIG. 6 depicts an enlarged view of a vicinity of a border between one of multiple $n^+$-type source regions 104 and one of multiple $p^{++}$-type contact regions 106 in FIG. 7. FIG. 7 is a plan view depicting a layout when the conventional semiconductor device is viewed from a front side of a semiconductor substrate thereof. FIG. 7 depicts a layout of the $n^+$-type source regions 104 and the $p^{++}$-type contact regions 106.

A conventional semiconductor device 110 depicted in FIGS. 6 and 7 is a vertical MOSFET that has a semiconductor substrate 130 containing silicon carbide and a trench gate structure in the semiconductor substrate 130, at a front surface thereof. The semiconductor substrate 130 includes epitaxial layers constituting an $n^-$-type drift region 102 and a p-type base region 103, respectively, and the semiconductor substrate 130 has, as a front surface, a main surface that includes, among the epitaxial layers, a p-type epitaxial layer that constitutes the p-type base region 103. The trench gate structure is configured by the p-type base region 103, the $n^+$-type source regions 104, the $p^{++}$-type contact regions 106, trenches 107, gate insulating films 108, and gate electrodes 109.

Each of the trenches 107 has a striped-shape extending in a first direction X (vertical direction in FIG. 7) parallel to the front surface of the semiconductor substrate 130. The $n^+$-type source regions 104 and the $p^{++}$-type contact regions 106 are each selectively provided between the front surface of the semiconductor substrate 130 and the p-type base region 103. The $n^+$-type source regions 104 are in contact with the gate insulating films 108 at sidewalls of the trenches 107. The $p^{++}$-type contact regions 106 are provided at positions apart from the trenches 107 and are in contact with the $n^+$-type source regions 104.

The trenches 107 are adjacent to one another and between the trenches 107, the $p^{++}$-type contact regions 106 are scattered in the first direction X and each of the $n^+$-type source regions 104 has, in a plan view, a lattice-like shape surrounding peripheries of the $p^{++}$-type contact regions 106. Portions of the $n^+$-type source regions 104 and the $p^{++}$-type contact regions 106 are disposed adjacent to one another, repeatedly alternating with one another in the first direction X. Each of the $n^+$-type source regions 104 has portions that are in contact with the gate insulating films 108 at the sidewalls of the trenches 107, extending linearly in the first direction X and portions that are each between a corresponding adjacent two of the $p^{++}$-type contact regions 106, the corresponding adjacent two being adjacent to each other in the first direction X.

Thus, the trench gate structure has a structure in which, the $n^+$-type source regions 104, the p-type base region 103, and an n-type current spreading region 123 are in contact with the gate insulating films 108 in an entire area of the sidewalls of the trenches 107 and extend in the first direction X. The $n^+$-type source regions 104 and the $p^{++}$-type contact regions 106 are each a diffused region selectively formed by ion-implantation in surface regions of the semiconductor substrate 130, at the front surface of the semiconductor substrate 130. The $p^+$-type regions 121, 122 are disposed at deep positions closer to an $n^+$-type drain region (not depicted) than are bottoms of the trenches 107. Reference numeral 111 is an interlayer insulating film.

As for a conventional vertical MOSFET having a trench gate structure, a device configured by source regions that include an $n^+$-type source region in contact with a source electrode, and an n-type source region between the $n^+$-type source region and a p-type base region has been proposed (for example, refer to Japanese Laid-Open Patent Publication No. 2020-141130). In Japanese Laid-Open Patent Publication No. 2020-141130, the n-type source region has a relatively low impurity concentration among the source regions and flow of the drift current is impeded by causing depletion to occur so as to penetrate the n-type source region over a wide range, whereby the saturation current value during load short-circuit is reduced and the short-circuit withstand capability is improved.

Further, as for another conventional vertical MOSFET having a trench gate structure, a device has been proposed in which a portion of a p-type base region is disposed between a trench and an $n^+$-type source region and between the trench and a $p^+$-type contact region; and an n-type shunt resistance region is disposed between these regions and a channel formed in a remaining portion of the p-type base region (for example, refer to Japanese Laid-Open Patent Publication No. 2020-077800). In Japanese Laid-Open Patent Publication No. 2020-077800, during an abnormality in which drift current that exceeds the rated current flows, the short-circuit withstand capability is improved by increasing the on-resistance to be higher than during the rated current by an amount of the resistance value of the n-type shunt resistance region.

Further, as for another conventional vertical MOSFET having a trench gate structure, a device has been proposed in which an n-type source region is formed by ion-implanting phosphorus (P) only in a portion thereof facing a channel in a depth direction and a remaining portion thereof is formed by ion-implanting arsenic (As) (for example, refer to Japanese Patent No. 6880669). In Japanese Patent No. 6880669, the channel length is shortened and device characteristics are improved by making the n-type source region relatively deep at the portion thereof facing the channel in the depth direction by ion-implanting phosphorus, which has a greater range reaching a deeper position than that of arsenic.

Further, as for another conventional vertical MOSFET having a planar gate structure, a device has been proposed in which, between a p-type base region and an $n^-$-type drift region, an $n^-$-type low-concentration region having an impurity concentration lower than that of the $n^-$-type drift region is provided farther apart from a JFET region than is the p-type base region (for example, refer to Japanese Laid-Open Patent Publication No. 2020-047782). In Japanese Laid-Open Patent Publication No. 2020-047782, during short-circuit, a depletion layer that spreads in the $n^-$-type drift region is deformed by the $n^-$-type low-concentration region, thereby preventing local electric field concentration on the current path of the drift current and suppressing local heat generation, whereby the short-circuit withstand capability is improved.

Further, as for another conventional vertical MOSFET having a trench gate structure, a device has been proposed in which an n-type source region has a relatively lower impurity concentration close to a trench and a relatively high impurity concentration in a portion apart from the trench (for example, refer to Japanese Laid-Open Patent Publication No. 2012-191056). In Japanese Laid-Open Patent Publication No. 2012-191056, leakage current density of a gate insulating film is kept low by a portion of the source region where the impurity concentration is relatively low and a favorable contact (electrical contact part) with a source electrode is formed by the portion where the impurity concentration is relatively high.

Further, as for another conventional vertical MOSFET having a trench gate structure, a device has been proposed in which in a surface region of a semiconductor substrate, at a front surface of the semiconductor substrate, a portion functioning as a channel between an $n^+$-type source region and a JFET region has a p-type impurity concentration lower than that of a p-type base region and a ratio of an n-type impurity to a p-type impurity greater than that of the p-type base region (for example, refer to Japanese Laid-Open Patent Publication No. 2015-032674). In Japanese Laid-Open Patent Publication No. 2015-032674, the gate threshold voltage is adjusted by the portion functioning as a channel between the $n^+$-type source region and the JFET region, whereby electron mobility is improved.

SUMMARY OF THE INVENTION

According to an embodiment of the invention, a semiconductor device includes: a first semiconductor region of a first conductivity type, provided in a semiconductor substrate that has a first main surface and a second main surface opposite to each other in a depth direction thereof; a second semiconductor region of a second conductivity type, provided between the first main surface of the semiconductor substrate and the first semiconductor region; a trench penetrating through the second semiconductor region, from the first main surface of the semiconductor substrate in the depth direction, and terminating in the first semiconductor region; a gate electrode provided in the trench, via a gate insulating film; a plurality of third semiconductor regions of the first conductivity type, selectively provided between the first main surface of the semiconductor substrate and the second semiconductor region, the plurality of third semiconductor regions each being in contact with the gate insulating film at a corresponding one of sidewalls of the trench; a plurality of fourth semiconductor regions, selectively provided between the first main surface of the semiconductor substrate and the second semiconductor region, the plurality of fourth semiconductor regions each being in contact with the gate insulating film at a corresponding one of the sidewalls of the trench; a plurality of fifth semiconductor regions of the second conductivity type, selectively provided between the first main surface of the semiconductor substrate and the second semiconductor region, apart from the trench, the plurality of fifth semiconductor regions having an impurity concentration higher than an impurity concentration of the second semiconductor region; a first electrode in contact with the plurality of third semiconductor regions, the plurality of fourth semiconductor regions, and the plurality of fifth semiconductor regions; and a second electrode in contact with a second main surface of the semiconductor substrate. The plurality of fourth semiconductor regions is a plurality of first-conductivity-type regions having an impurity concentration of the first conductivity type lower than an impurity concentration of the plurality of third semiconductor regions or is a plurality of second-conductivity-type regions having an impurity concentration of the second conductivity type lower than the impurity concentration of the second semiconductor region at a portion thereof that is in a vicinity of and along the sidewalls of the trench.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a perspective view depicting the structure the semiconductor device according to the embodiment.

FIG. 5 is a characteristics diagram depicting results of simulation of a relationship between on-resistance per unit area and a saturation current value of an example.

DETAILED DESCRIPTION OF THE INVENTION

Figure 6:
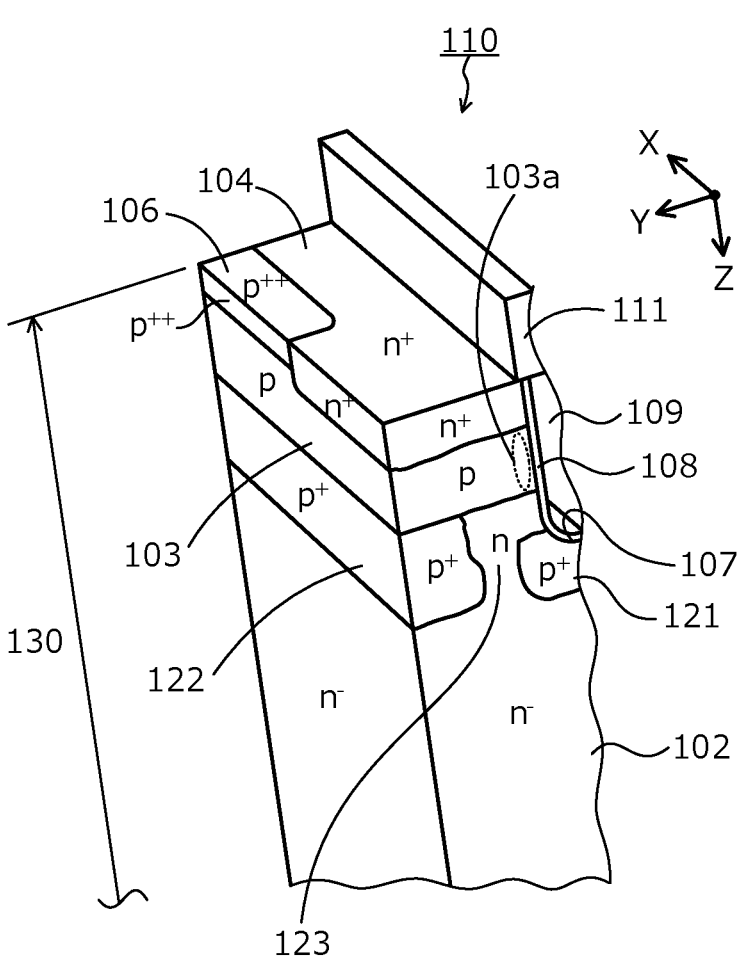
FIG. 6 is a perspective view depicting a structure of a conventional semiconductor device.
Figure 7:
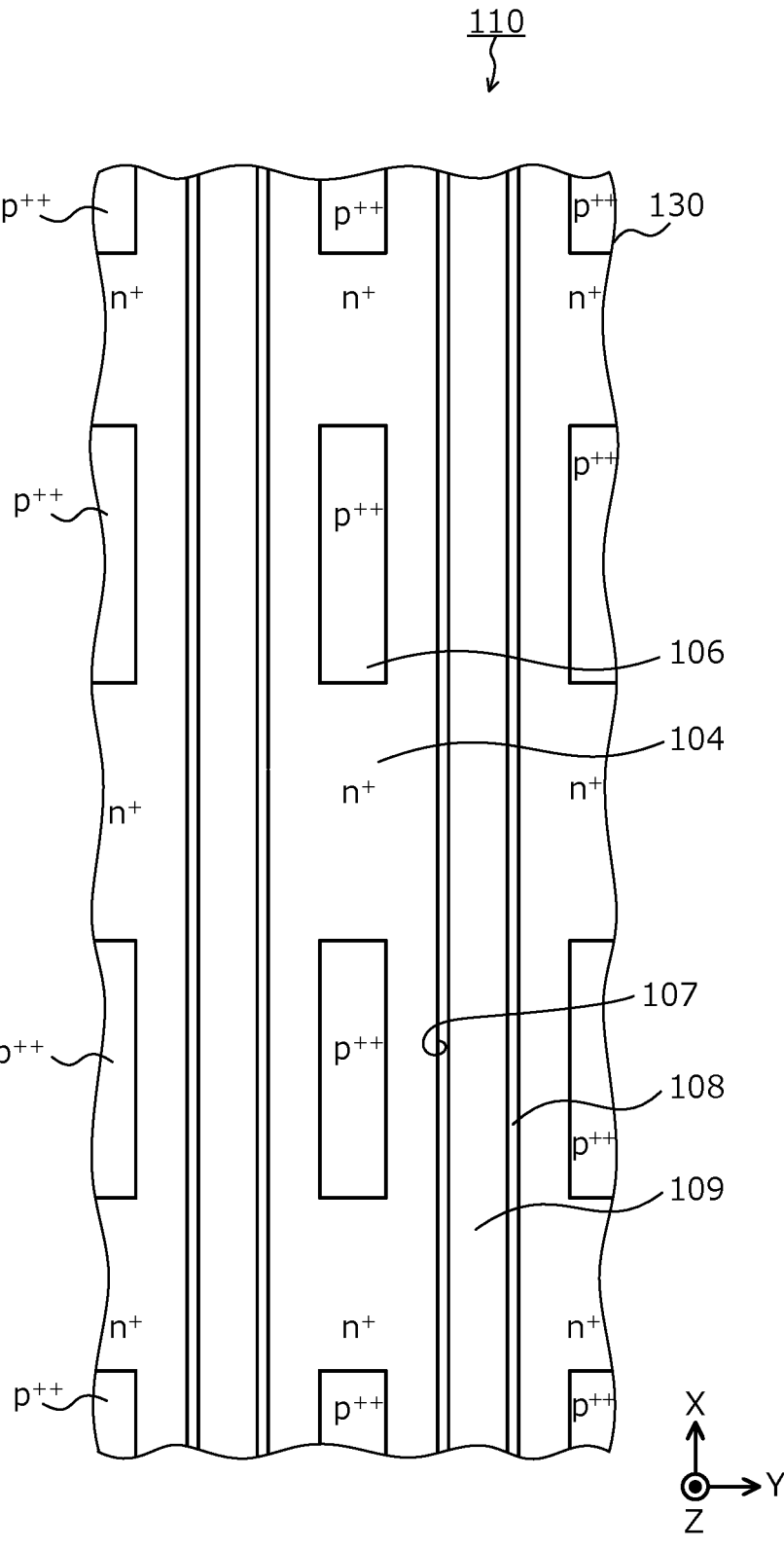
FIG. 7 is a plan view depicting a layout when the conventional semiconductor device is viewed from a front side of a semiconductor substrate thereof.

First problems associated with the conventional techniques are described. In the conventional semiconductor device 110 (refer to FIGS. 6 and 7), in an instance in which a small saturation current value is set, the following problems occur due to the trench gate structure. As described above, the p$^-$-type low-concentration region is disposed in the portion of the p-type base region where the channel is formed and thus, when a small saturation current value is set, an epitaxial growth process, ion implantation process, etc. have to be added to form the p$^-$-type low-concentration region (not depicted) in a portion 103$a$ of the p-type base region 103 where the channel is formed. Thus, the number of processes increases, leading to increased cost.

As described above, in an instance in which the shape and the impurity concentration gradient of the JFET region (portion between the p$^+$-type regions 121, 122 that are adjacent to each other) are used to set a small saturation current value, the on-resistance increases rapidly and electrical characteristics are sacrificed. Further, to form the p$^+$-type regions 121, 122 to have a particular shape at deep portions closer to the n$^+$-type drain region (not depicted) than are the bottoms of the trenches 107 so that a predetermined saturation current value is obtained, processes therefor become complicated and preparation of high-cost ion-implantation equipment capable of implanting ions by a high acceleration energy is necessary, which lead to increased cost.

Embodiments of a semiconductor device according to the present invention are described in detail with reference to the accompanying drawings. In the present description and accompanying drawings, layers and regions prefixed with n or p mean that majority carriers are electrons or holes. Additionally, + or – appended to n or p means that the impurity concentration is higher or lower, respectively, than layers and regions without + or –. In the description of the embodiments below and the accompanying drawings, main portions that are identical are given the same reference numerals and are not repeatedly described.

Figure 1:
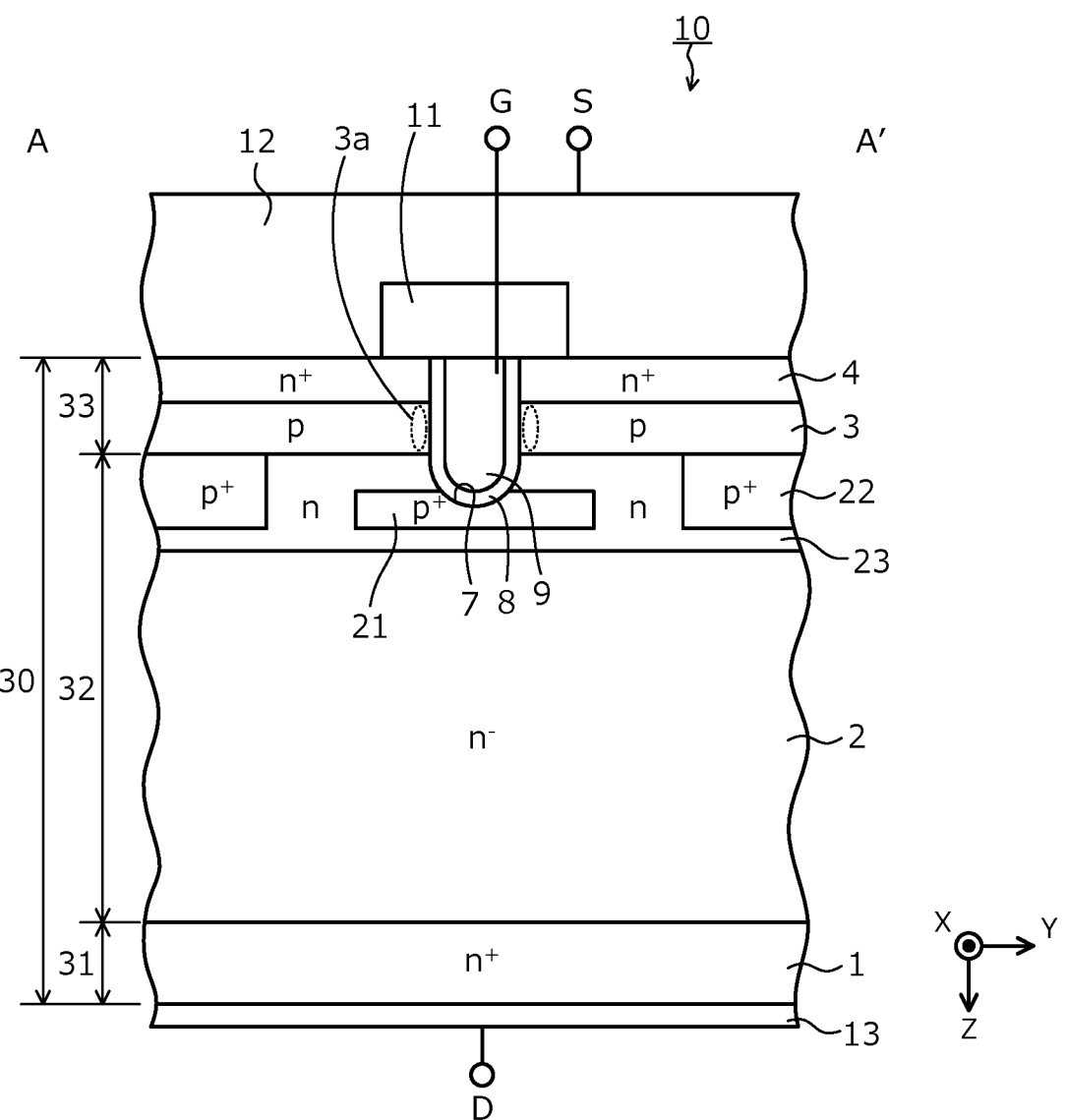
FIG. 1 is a cross-sectional view depicting a structure of a semiconductor device according to an embodiment.
Figure 2:
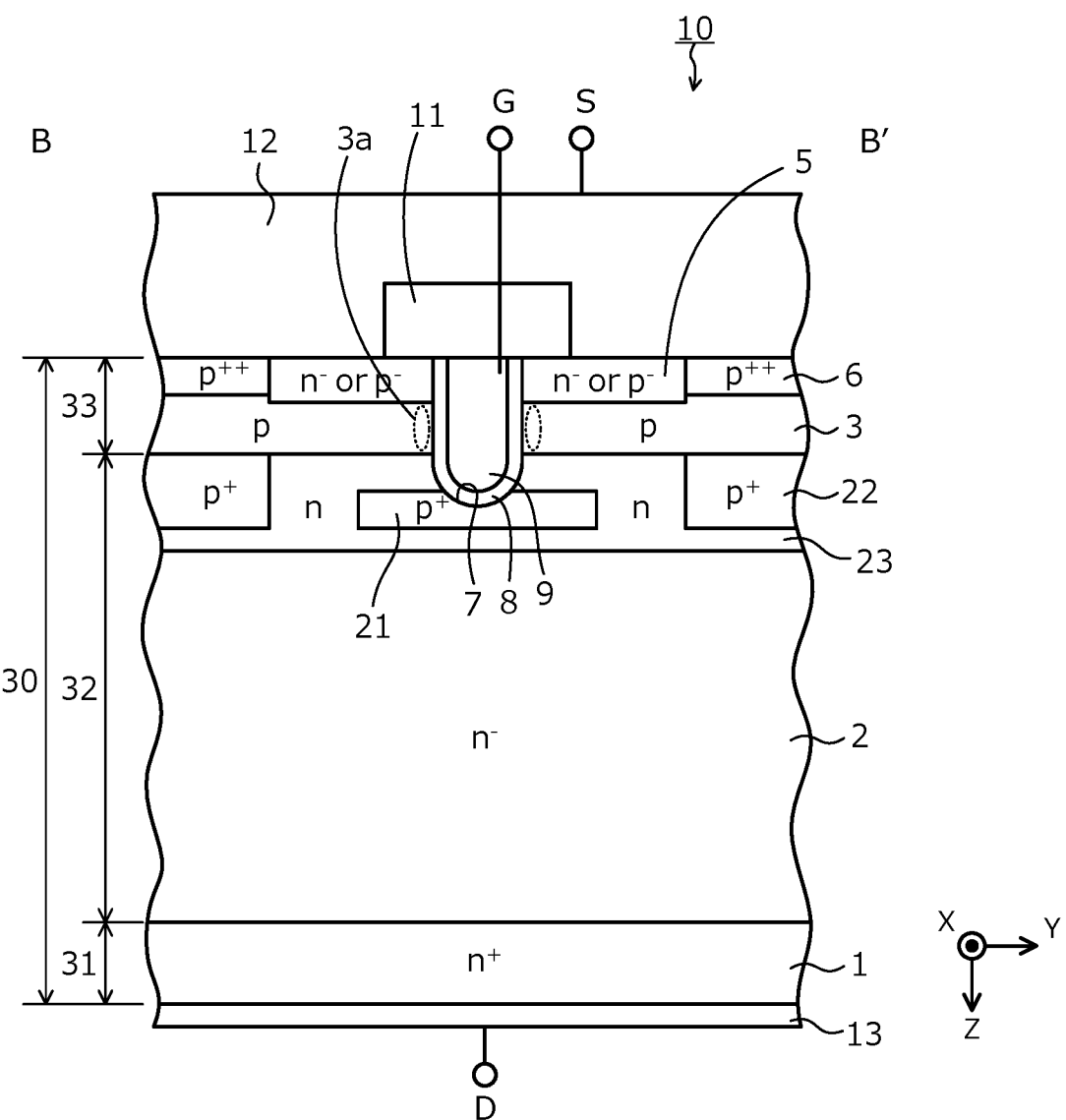
FIG. 2 is a cross-sectional view depicting the structure of the semiconductor device according to the embodiment.
Figure 3:
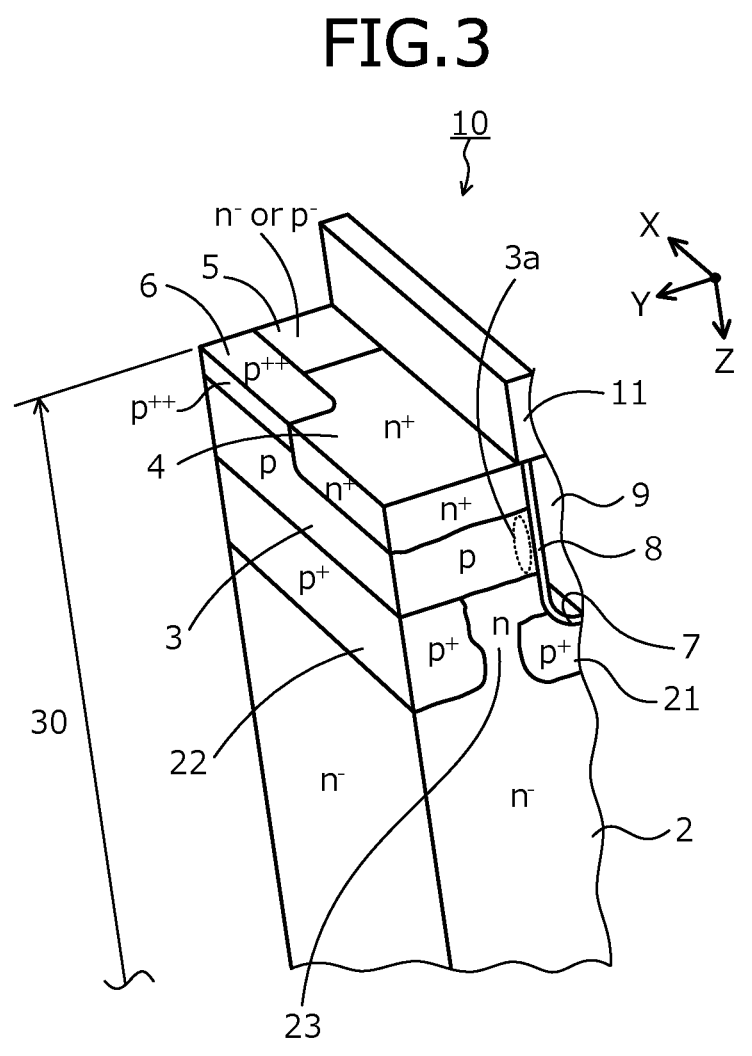
Figure 4:
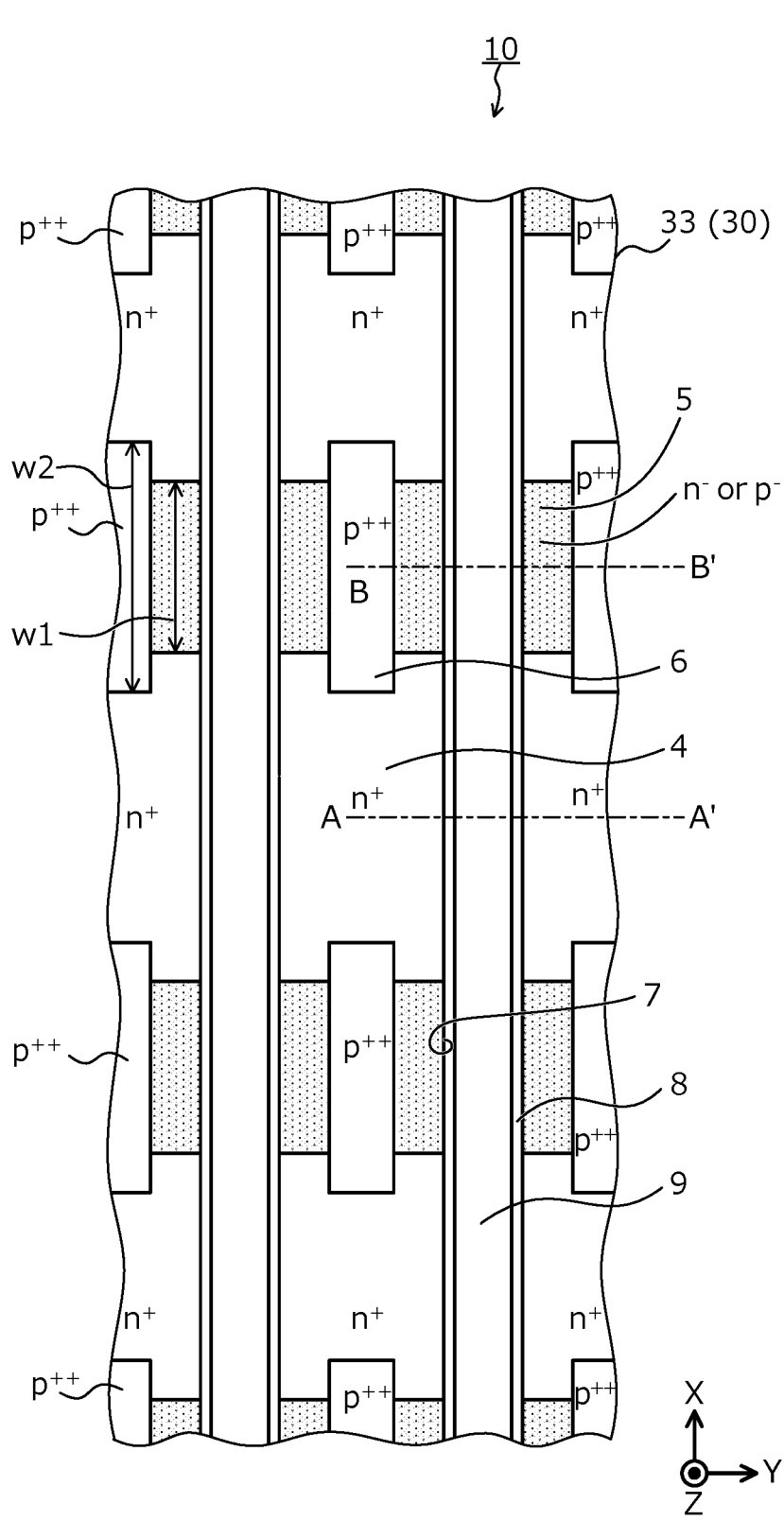
FIG. 4 is a plan view depicting a layout when the semiconductor device according to the embodiment is viewed from a front side of a semiconductor substrate thereof.

A structure of a semiconductor device according to an embodiment is described. FIGS. 1 and 2 are cross-sectional views depicting the structure of the semiconductor device according to the embodiment. FIG. 3 is a perspective view depicting the structure the semiconductor device according to the embodiment. FIG. 4 is a plan view depicting a layout when the semiconductor device according to the embodiment is viewed from a front side of a semiconductor substrate thereof. FIGS. 1 and 2 depict cross-sections of the structure along cutting line A-A' and cutting line B-B' in FIG. 4, respectively. FIG. 3 depicts an enlarged view of borders between n$^+$-type source regions 4, low-concentration regions 5, and p$^{++}$-type contact regions 6 in FIG. 4. FIG.

4 depicts a layout of the n$^+$-type source regions 4, the low-concentration regions 5 (hatched portion), and the p$^{++}$-type contact regions 6.

A semiconductor device 10 according to the embodiment depicted in FIGS. 1 to 4 is a vertical MOSFET having a trench gate structure provided in a front side of a semiconductor substrate (semiconductor chip) 30 that contains silicon carbide (SiC) as a semiconductor material. The semiconductor substrate 30 is an epitaxial substrate in which epitaxial layers 32, 33 constituting, respectively, an n$^-$-type drift region (first semiconductor region) 2 and p-type base regions (second semiconductor regions) 3 are sequentially stacked in the order stated herein on a front surface of an n$^+$-type starting substrate 31 containing SiC as a semiconductor material. The semiconductor substrate 30 has, as a front surface (first main surface), a main surface having the epitaxial layer 33 that constitutes the p-type base regions 3 and has, as a back surface (second main surface), a main surface having the n$^+$-type starting substrate 31.

The n$^+$-type starting substrate 31 is an n$^+$-type drain region 1. The n$^-$-type drift region 2 is adjacent to the n$^+$-type starting substrate 31. The p-type base regions 3 are provided between the front surface of the semiconductor substrate 30 and the n$^-$-type drift region 2. The trench gate structure is configured by the p-type base regions 3, the n$^+$-type source regions (third semiconductor regions) 4, the low-concentration regions (fourth semiconductor regions) 5, the p$^{++}$-type contact regions (fifth semiconductor regions) 6, trenches 7, gate insulating films 8, and gate electrodes 9. Between the n$^-$-type drift region 2 and the p-type base regions 3, an n-type current spreading region 23 and p$^+$-type regions 21, 22 may each be provided selectively at positions closer to the n$^+$-type drain region 1 than are bottoms of the trenches 7.

The n-type current spreading region 23 and the p$^+$-type regions 21, 22 are diffused regions formed in the n$^-$-type epitaxial layer 32 by ion implantation. A portion of the n$^-$-type epitaxial layer 32, excluding the n-type current spreading region 23 and the p$^+$-type regions 21, 22 is the n$^-$-type drift region 2. The n-type current spreading region 23 is a so-called current spreading layer (CSL) that reduces carrier spreading resistance. The n-type current spreading region 23 is in contact with the p-type base regions 3 and the n$^-$-type drift region 2 in a depth direction Z, between the trenches 7, which are adjacent to one another.

The n-type current spreading region 23 extends to the trenches 7 in a direction parallel to the front surface of the semiconductor substrate 30 and is in contact with the gate insulating films 8. A portion of the n-type current spreading region 23 between any adjacent two of the p$^+$-type regions 21, 22 constitutes a JFET region. In an instance in which the n-type current spreading region 23 is not provided, instead of the n-type current spreading region 23, the n$^-$-type drift region 2 extends to the p-type base regions 3 in a direction from the n$^+$-type drain region 1, extends to the trenches 7 in the direction parallel to the front surface of the semiconductor substrate 30, and is in contact with the gate insulating films 8. A portion of the n$^-$-type drift region 2 between any adjacent two of the p$^+$-type regions 21, 22 constitutes a JFET region.

The p$^+$-type regions 21, 22 are fixed to a potential of a later-described source electrode (first electrode) 12 and have a function of mitigating electric field applied to the gate insulating films 8 at the bottoms of the trenches 7, by being depleted (or causing the n-type current spreading region 23 to be depleted, or both), when the MOSFET (the semiconductor device 10) is off. The p$^+$-type regions 21, 22 extend linearly in the later-described first direction X along each of the trenches 7. The $p^+$-type regions 21 are provided apart from the p-type base regions 3 and face the bottoms of the trenches 7 in the depth direction Z. At the bottoms of the trenches 7, the $p^+$-type regions 21 may be in contact with the gate insulating films 8 or may be apart from the bottoms of the trenches 7.

The $p^+$-type regions 21 may face bottom corner portions (corners) of the trenches 7 in the depth direction Z. The bottom corner portions of the trenches 7 are borders between the bottoms and sidewalls of the trenches 7. The $p^+$-type regions 22 are each provided between a corresponding adjacent two of the trenches 7, apart from the trenches 7 and the $p^+$-type regions 21. Each of the $p^+$-type regions 22 has a surface that faces the $n^+$-type source regions 4 and is in contact with a corresponding one of the p-type base regions 3, the $p^+$-type regions 22 being electrically connected to the source electrode 12 via the p-type base regions 3. The $p^+$-type regions 22 face the $p^{++}$-type contact regions 6 in the depth direction Z. A width (width in a second direction Y) of each of the $p^+$-type regions 22 is about at least a width (width in the second direction Y) of the $p^{++}$-type contact regions 6.

The trenches 7 penetrate through the epitaxial layer 33 in the depth direction Z from the front surface of the semiconductor substrate 30, reach the n-type current spreading region 23 (in an instance in which the n-type current spreading region 23 is not provided, the $n^-$-type drift region 2), and terminate in the n-type current spreading region 23 or in the $p^+$-type regions 21. The trenches 7 are each disposed in a stripe-like shape extending in the first direction X (vertical direction in FIG. 4) parallel to the front surface of the semiconductor substrate 30. Between each adjacent two of the trenches 7, the $n^+$-type source regions 4, the low-concentration regions 5, and the $p^{++}$-type contact regions 6 are each selectively provided between the front surface of the semiconductor substrate 30 and the p-type base regions 3.

Portions of the epitaxial layer 33 excluding the $n^+$-type source regions 4, the low-concentration regions 5, and the $p^{++}$-type contact regions 6 constitute the p-type base regions 3. The epitaxial layer 33 is an $n^-$-type epitaxial layer or a $p^-$-type epitaxial layer having a p-type impurity concentration lower than that of the p-type base regions 3. The p-type base regions 3, the $n^+$-type source regions 4, and the $p^{++}$-type contact regions 6 are diffused regions formed in the epitaxial layer 33 by ion implantation. The low-concentration regions 5 are surface regions (front surface regions of the semiconductor substrate 30) of the epitaxial layer 33 free of the $n^+$-type source regions 4 and the $p^{++}$-type contact regions 6.

In particular, the epitaxial layer 33 is an $n^-$-type epitaxial layer with an n-type impurity concentration about equal to the impurity concentration of the $n^-$-type drift region 2 or is a $p^-$-type epitaxial layer with a p-type impurity concentration in a range of about, for example, $1\times10^{15}/cm^3$ to $1\times10^{16}/cm^3$. In an instance in which the epitaxial layer 33 is an $n^-$-type, in an edge termination region (not depicted) surrounding a periphery of an active region, a p-type region configuring a voltage withstanding structure may be formed in a surface region of the epitaxial layer 33 by ion-implantation. In an instance in which the epitaxial layer 33 is a $p^-$-type, the ion-implantation time may be shortened and the amount of ion implanted to form the p-type base regions 3 may be reduced.

Further, in an instance of the epitaxial layer 33 being a $p^-$-type, the epitaxial layer 33 of the $p^-$-type in the edge termination region is removed, the $n^-$-type epitaxial layer 32 there below is exposed, and the p-type region configuring the voltage withstanding structure is formed by ion implantation at the exposed surface of the $n^-$-type epitaxial layer 32. The active region is a region in which unit cells (constituent units of a device) of the MOSFET are disposed and through which a main current (drift current) flows. The active region is disposed, for example, in substantially a center of the semiconductor substrate 30. In FIGS. 1 and 2, while only a single unit cell of the MOSFET is depicted, in the active region of the semiconductor substrate 30, multiple unit cells each having the same structure are disposed adjacently to one another.

The edge termination region is a region between the active region and a chip end (end of the semiconductor substrate 30), surrounds the periphery of the active region, and sustains a breakdown voltage by mitigating electric field of a front portion of the semiconductor substrate 30. The breakdown voltage is a voltage limit at which drain-source voltage does not further increase when avalanche breakdown due to a pn junction occurs and drain-source current increases. In the edge termination region, for example, a general voltage withstanding structure such as a junction termination extension (JTE) structure, a field limiting ring (FLR) structure, etc. is disposed.

The p-type base regions 3 are formed by ion-implantation of a p-type impurity such as aluminum (AI), from a surface (the front surface of the semiconductor substrate 30) of the epitaxial layer 33. This ion implantation adjusts the resistance of a channel (n-type inversion layer) formed in portions (hereinafter, channel portions) 3a of each of the p-type base regions 3, along the trenches 7 when the MOSFET is on. As for impurity distribution in each of the p-type base regions 3, a peak impurity concentration (maximum concentration) occurs at a center in the depth direction Z and the impurity concentration gradually decreases in directions from the depth position of the peak concentration to the front surface and to the back surface of the semiconductor substrate 30. The channel portions 3a of each of the p-type base regions 3 each has a length substantially equal to a length of each of the trenches 7 in a longitudinal direction (the first direction X) of the trenches 7 and extends linearly in the first direction X, along the sidewalls of the trenches 7.

The epitaxial layer 33 may be formed having a p-type impurity concentration substantially equal to the impurity concentration of the p-type base regions 3 and ion implantation for adjusting the channel resistance value in only the channel portions 3a of the p-type base regions 3 may be performed. In this instance, the impurity distribution is such that the peak impurity concentration of each of the p-type base regions 3 is at the center in the depth direction Z in only the channel portions 3a, the impurity concentration gradually becomes lower in the directions from the depth positions of the peak concentration to the front surface and to the back surface of the semiconductor substrate 30, and the impurity distribution is substantially uniform in the depth direction Z in portions of the epitaxial layer 33 left as is as a p-type, free of ion implantation. Substantially equal impurity concentrations and substantially equal lengths mean the same impurity concentration and the same length within a range having an allowable error due to process variation.

The $n^+$-type source regions 4, the low-concentration regions 5, and the $p^{++}$-type contact regions 6 are exposed at the front surface of the semiconductor substrate 30. Being exposed at the front surface of the semiconductor substrate 30 means being in contact with the later-described source electrode 12 at the front surface of the semiconductor substrate 30. The n+-type source regions 4 and the low-concentration regions 5 are in contact with the gate insulating films 8 at the sidewalls of the trenches 7 and are adjacent to the channel portions 3a of the p-type base regions 3 in the depth direction Z. The n+-type source regions 4 and the low-concentration regions 5 are disposed repeatedly alternating with one another adjacently in the first direction X. The p++-type contact regions 6 are provided at positions apart from the trenches 7 and are in contact with the n+-type source regions 4. The n+-type source regions 4 and the p++-type contact regions 6 are disposed repeatedly alternating with one another adjacently in the first direction X.

Preferably, the low-concentration regions 5 are disposed only between the trenches 7 and the p++-type contact regions 6. In other words, the low-concentration regions 5 and the p++-type contact regions 6 are preferably adjacent to one another in the second direction Y, which is parallel to the front surface of the semiconductor substrate 30 and orthogonal to the first direction X. In an instance in which the low-concentration regions 5 and the p++-type contact regions 6 are not adjacent to one another in the second direction Y, the n+-type source regions 4 between any adjacent two of the low-concentration regions 5 in the first direction X and the n+-type source regions 4 between any adjacent two of the p++-type contact regions 6 in the first direction X are fragmented and form complex patterns, whereby shapes of the n+-type source regions 4 may be difficult to form.

In other words, the low-concentration regions 5 and the p++-type contact regions 6 are disposed adjacent to another in the second direction Y, whereby between any adjacent two of the trenches 7, the p++-type contact regions 6 are scattered in the first direction X and the low-concentration regions 5 are disposed between the trenches 7 and the p++-type contact regions 6 so as to be scattered in the first direction X. The n+-type source regions 4 between the low-concentration regions 5 adjacent in the first direction X are continuous in the second direction Y with the n+-type source regions 4 between the p++-type contact regions 6 adjacent in the first direction X, thereby forming a substantially rectangular shape with a relatively large surface area in a plan view. The low-concentration regions 5 and the p++-type contact regions 6 may be in contact with one another.

A dimension w1 of each of the low-concentration regions 5 in the first direction X is not more than a width w2 of each of the p++-type contact regions 6 in the first direction X. Thus, the n+-type source regions 4 being in contact with the low-concentration regions 5 and the p++-type contact regions 6 in the first direction X and in contact with the gate insulating films 8 at the sidewalls of the trenches 7 in the second direction Y, thereby form a substantially rectangular shape in a plan view. Alternatively, the n+-type source regions 4 form substantially an H-shape having linear portions in contact with the gate insulating films 8 at the sidewalls of the trenches 7, extending in the first direction X with ends thereof in the first direction X each terminating between the trenches 7 and the p++-type contact regions 6, the H-shape further having a portion sandwiched between an adjacent two of the p++-type contact regions 6 adjacent to each other in the first direction X.

In particular, preferably, the dimension w1 of each of the low-concentration regions 5 in the first direction X, for example, is within a range of about 1.0 μm to 4.0 μm. The dimension w1 of each of the low-concentration regions 5 in the first direction X corresponds to the length of the portion of each of the low-concentration regions 5 in contact with the gate insulating films 8 at the sidewalls of the trenches 7 in the first direction X. Therefore, an instance in which the dimension w1 of each of the low-concentration regions 5 in the first direction X is less than the lower limit value described above is undesirable because the effect of providing the low-concentration regions 5 may not be obtained. In an instance in which the dimension w1 of each of the low-concentration regions 5 in the first direction X exceeds the upper limit value described above, the resistance of the current path of the drift current increases when the MOSFET is on, whereby the on-resistance increases and thus, is undesirable.

In the low-concentration regions 5, a p-type impurity is introduced by ion implantation of a p-type impurity for forming the p-type base regions 3 (or for adjusting channel resistance). The ion implantation is performed under conditions so that the impurity concentration becomes greatest (has a peak concentration) at a depth position (range) of a center of each of the channel portions 3a of the p-type base regions 3 in the depth direction Z, from a surface (the front surface of the semiconductor substrate 30) of the epitaxial layer 33. Thus, the low-concentration regions 5 have an impurity distribution in which the impurity concentration is greatest (has a peak concentration) at a predetermined depth position and from the depth position where the concentration peaks, the impurity concentration continuously decreases in the depth direction Z.

In particular, in an instance in which the epitaxial layer 33 is an n−-type, the low-concentration regions 5 are n−-type regions (first-conductivity-type regions) having an n-type impurity concentration lower than that of the n+-type source regions 4. The low-concentration regions 5 of the n−-type have an n-type impurity concentration distribution (first-conductivity-type impurity concentration distribution) in which the impurity concentration is highest in a vicinity of the front surface of the semiconductor substrate 30 and becomes continuously lower closer to back surface (the n+-type drain region 1) of the semiconductor substrate 30. Due to a p-type impurity being introduced into the low-concentration regions 5 when the p-type base regions 3 are formed, the n-type impurity concentration of the low-concentration regions 5 of the n−-type is slightly lower than the n-type impurity concentration when the epitaxial layer 33 of the n−-type is epitaxially grown. The n-type impurity concentration of the low-concentration regions 5 of the n−-type is set to be in a range of, for example, about $1\times10^{14}/cm^3$ to $1\times10^{18}/cm^3$.

In an instance in which the epitaxial layer 33 is a p−-type or a p-type, the low-concentration regions 5 are p−-type regions (second-conductivity-type regions) having a p-type impurity concentration lower than the p-type impurity concentration of the channel portions 3a of the p-type base regions 3. The low-concentration regions 5 of the p−-type have a p-type impurity concentration distribution (second-conductivity-type impurity concentration distribution) in which the impurity concentration is lowest in a vicinity of the front surface of the semiconductor substrate 30 and becomes continuously higher closer to the back surface of the semiconductor substrate 30. Due to a p-type impurity being introduced into the low-concentration regions 5 when the p-type base regions 3 are formed, the p-type impurity concentration of the low-concentration regions 5 of the p−-type is slightly higher than the p-type impurity concentration when the epitaxial layer 33 of the p−-type is epitaxially grown. The p-type impurity concentration of the low-concentration regions 5 of the p−-type is set to be in a range of, for example, about $1\times10^{14}/cm^3$ to $1\times10^{18}/cm^3$.

The n-type impurity concentration is relatively high in surface regions (portions at the front surface of the semiconductor substrate 30) of the low-concentration regions 5 of the n⁻-type, whereby the resistance of the surface regions of the low-concentration regions 5 when the MOSFET is on is low. Further, the p-type impurity concentration is relatively low in the surface regions of the low-concentration regions 5 of the p⁻-type, whereby the surface regions of the low-concentration regions 5 are inverted to an n-type when the MOSFET is on and the resistance thereof decreases. Thus, irrespective of whether the low-concentration regions 5 are provided as an n⁻-type or a p⁻-type, drift current flows into the low-resistance surface regions of the low-concentration regions 5 from the n⁺-type source regions 4 when the MOSFET is on and the area into which the drift current flows in a direction from the front surface of the semiconductor substrate 30 to the source electrode 12 increases, whereby the on-resistance may be reduced.

In the trenches 7, the gate insulating films 8 are provided along the inner wall of each of the trenches 7 and the gate electrodes 9 are provided on the gate insulating films 8. The gate insulating films 8 are in contact with the n⁺-type source regions 4, the low-concentration regions 5, the p-type base regions 3, and the n-type current spreading region 23 (in an instance in which the n-type current spreading region 23 is omitted, the n⁻-type drift region 2), at the inner walls of the trenches 7. The trench gate structure is a structure in which, at the sidewalls of the trenches 7, portions where the n⁺-type source regions 4, the p-type base regions 3, and the n-type current spreading region 23 are in contact with the gate insulating films 8 are disposed repeatedly alternating with and periodically adjacent to, in the first direction X, portions where the low-concentration regions 5, the p-type base regions 3, and the n-type current spreading region 23 are in contact with the gate insulating films 8.

An interlayer insulating film 11 is provided in an entire area of the front surface of the semiconductor substrate 30 and covers the gate electrodes 9. The interlayer insulating film 11 has contact holes in which the n⁺-type source regions 4, the low-concentration regions 5, and the p⁺⁺-type contact regions 6 are exposed. The source electrode 12, in the contact holes of the interlayer insulating film 11, is in contact with the n⁺-type source regions 4, the low-concentration regions 5, and the p⁺⁺-type contact regions 6 and forms ohmic contacts with the n⁺-type source regions 4 and the p⁺⁺-type contact regions 6. A drain (second electrode) electrode 13 is provided in an entire area of the back surface (back surface of the n⁺-type starting substrate 31) of the semiconductor substrate 30. The drain electrode 13 is in contact with the n⁺-type drain region 1 (the n⁺-type starting substrate 31) and is electrically connected to the n⁺-type drain region 1.

Operation of the semiconductor device 10 according to the embodiment is described. When voltage (forward voltage) that is positive with respect to the source electrode 12 is applied to the drain electrode 13 and gate-source voltage at least equal to the gate threshold voltage is applied to the gate electrodes 9, a channel (n-type inversion layer) is formed in portions (the channel portions 3a) of the p-type base regions 3 along the sidewalls of the trenches 7. As a result, a drift current flows in a direction from the drain electrode 13, through the n⁺-type drain region 1, the n⁻-type drift region 2, the n-type current spreading region 23, the channel, and the n⁺-type source regions 4, to the source electrode 12 and the MOSFET (the semiconductor device 10) turns on.

When the MOSFET is on, while the channel is formed directly beneath (sides facing the n⁺-type drain region 1) both the n⁺-type source regions 4 and the low-concentration regions 5, the drift current flows only into the n⁺-type source regions 4 from the channel and does not flow to the low-concentration regions 5 from the channel. Thus, the drift current that flows in the channel directly beneath the low-concentration regions 5 flows along an interface between the channel and the low-concentration regions 5, in a direction parallel to the front surface of the semiconductor substrate 30, to the n⁺-type source regions 4. Accordingly, the current path of the drift current increases in length by the distance that the drift current flows in the channel, from directly beneath the low-concentration regions 5 to the n⁺-type source regions 4, whereby the resistance increases.

The resistance of the current path of the drift current is increased by the low-concentration regions 5, whereby, as compared to a conventional structure free of the low-concentration regions 5 (refer to FIGS. 6 and 7), the channel is pinched-off by a lower drain-source voltage. In other words, the pinch-off voltage of the channel may be reduced by the low-concentration regions 5. As a result, the time that elapses until drain-source current (short circuit current) that flows during a load short-circuit or during an arm short-circuit is blocked may be shortened and the saturation current value may be reduced, whereby the short-circuit withstand capability may be improved. The saturation current value is the value of the saturation of the drain-source current dependent on and determined by the gate-source voltage.

The low-concentration regions 5 are provided, whereby as compared to the conventional structure free of the low-concentration regions 5, while the area of the ohmic contact of the source electrode 12 is reduced by the area of the contact between the source electrode 12 and the low-concentration regions 5 and the on-resistance per unit area increases, the effect of reducing the saturation current value increases. As a result, the tradeoff relationship between reducing the on-resistance and reducing the saturation current value may be improved (refer to later-described FIG. 5). Further, the impurity concentration of the low-concentration regions 5 is set to be low within the range described above, whereby electrical characteristics of the MOSFET are not adversely affected by the increased on-resistance resulting from providing the low-concentration regions 5.

Further, in the low-concentration regions 5 of the n⁻-type, the n-type impurity concentration of the surface regions thereof (portions thereof at the front surface of the semiconductor substrate 30) is set to be relatively high or in the low-concentration regions 5 of the p⁻-type, the p-type impurity concentration of the surface region thereof is set to be relatively low, whereby the resistance of the surface regions of the low-concentration regions 5 is relatively low when the MOSFET is on. As a result, drift current flows into the relatively low-resistance surface regions of the low-concentration regions 5, from the n⁺-type source regions 4; and the area of the current path of the drift current that flows from the semiconductor substrate 30 into the source electrode 12 increases by the area of the joined surfaces of the semiconductor substrate 30 and the source electrode 12, whereby the on-resistance may be reduced.

On the other hand, when forward voltage is applied between the source and drain and a gate-source voltage lower than the gate threshold voltage is applied to the gate electrodes 9, pn junctions (main junctions) between the p⁺-type regions 21, 22, the p-type base regions 3, the n-type current spreading region 23, and the n⁻-type drift region 2 are reverse biased, whereby the flow of the drift current ceases and the MOSFET maintains an off-state. Further, a depletion layer spreads in the $p^+$-type regions 21, 22, or the n-type current spreading region 23, or both, from the pn junctions, whereby electric field applied to the gate insulating films 8 at the bottoms of the trenches 7 is mitigated.

Next, a method of manufacturing the semiconductor device 10 according to the embodiment is described. First, the $n^+$-type starting substrate ($n^+$-type starting wafer) 31 containing silicon carbide as a semiconductor material is prepared. Next, at the front surface of the $n^+$-type starting substrate 31, the $n^-$-type epitaxial layer 32 constituting the $n^-$-type drift region 2 is epitaxially grown (deposited). Next, in surface regions of the $n^-$-type epitaxial layer 32, the $p^+$-type regions 21 and lower portions of the $p^+$-type regions 22 (portions facing the $n^+$-type drain region 1) are each selectively formed by photolithography and ion implantation of a p-type impurity, so as to repeatedly alternate with and be apart from one another in the second direction Y.

By photolithography and ion implantation of an n-type impurity, in a surface region of the $n^-$-type epitaxial layer 32, a lower portion of the n-type current spreading region 23 is formed between each one of the $p^+$-type regions 21 and an adjacent one of the $p^+$-type regions 22. A sequence in which the $p^+$-type regions 21, the lower portions of the $p^+$-type regions 22, and the lower portion of the n-type current spreading region 23 are formed may be variously changed. A portion of the $n^-$-type epitaxial layer 32 closer to the $n^+$-type starting substrate 31 than are the $p^+$-type regions 21, 22, and the n-type current spreading region 23 constitutes the $n^-$-type drift region 2. Next, epitaxial growth of the $n^-$-type epitaxial layer 32 is further performed, thereby, increasing the thickness thereof to a predetermined thickness.

Next, in the portion of the $n^-$-type epitaxial layer 32 by which the thickness is increased, upper portions of the $p^+$-type regions 22 (portions facing the $n^+$-type source regions 4) are selectively formed by photolithography and ion implantation of a p-type impurity, so as to be continuous with the lower portions of the $p^+$-type regions 22, respectively, in the depth direction Z. In the portion of the $n^-$-type epitaxial layer 32 by which the thickness is increased, upper portions of the n-type current spreading region 23 are formed by photolithography and ion implantation of an n-type impurity, so as to be continuous with the lower portion of the n-type current spreading region 23 in the depth direction Z. A sequence in which the upper portions of the $p^+$-type regions 22 and the upper portions of the n-type current spreading region 23 are formed may be variously changed.

Next, on the $n^-$-type epitaxial layer 32, the epitaxial layer 33 of an $n^-$-type or a $p^-$-type and constituting the p-type base regions 3 is epitaxially grown (deposited).

By the processes up to here, the semiconductor substrate (semiconductor wafer) 30 in which the epitaxial layers 32, 33 are sequentially stacked on the front surface of the $n^+$-type starting substrate 31 is fabricated (manufactured). Next, in the epitaxial layer 33, a p-type impurity such as aluminum is ion-implanted so that, at a depth position of a center (in the depth direction Z) of each portion of the epitaxial layer 33 left as one of the p-type base regions 3, a peak concentration of the impurity is exhibited, thereby forming the p-type base regions 3 and adjusting the channel resistance value of the channel portions 3a.

Next, in surface regions of the epitaxial layer 33, the $n^+$-type source regions 4 are selectively formed by photolithography and ion implantation of an n-type impurity, and the $p^{++}$-type contact regions 6 are selectively formed by photolithography and ion implantation of a p-type impurity. Portions of surface regions of the epitaxial layer 33 constituting the low-concentration regions 5 are left as the conductivity type ($n^-$-type or $p^-$-type) of the epitaxial layer 33 and are free of the $n^+$-type source regions 4 and the $p^{++}$-type contact regions 6. Portions of the epitaxial layer 33 closer to the $n^-$-type epitaxial layer 32 than are the $n^+$-type source regions 4, the low-concentration regions 5, and the $p^{++}$-type contact regions 6 constitute the p-type base regions 3.

In the edge termination region, in surface regions of the epitaxial layer 33 of the $n^-$-type or in the edge termination region, the epitaxial layer 33 of the $p^-$-type is removed and in surface regions of the exposed $n^-$-type epitaxial layer 32, a p-type region configuring the voltage withstanding structure is selectively formed by photolithography and ion implantation of a p-type impurity. A sequence in which the $n^+$-type source regions 4, the $p^{++}$-type contact regions 6, and each p-type region constituting the voltage withstanding structure are formed may be variously changed. Next, a heat treatment for activating all the ion-implanted impurities is performed. The heat treatment for activating the impurities may be performed for each ion implantation.

Next, by photolithography and etching, the trenches 7 are formed that penetrate through the $n^+$-type source regions 4, the low-concentration regions 5, and the p-type base regions 3 in the depth direction Z from the front surface (surface of the epitaxial layer 33) of the semiconductor substrate 30, reach the n-type current spreading region 23, and terminate in the n-type current spreading region 23. Next, by a general method, the gate insulating films 8, the gate electrodes 9, the interlayer insulating film 11, the source electrode 12, and the drain electrode 13 are formed. Thereafter, semiconductor wafer (the semiconductor substrate 30) is diced (cut) into individual chips, whereby the MOSFET (the semiconductor device 10) depicted in FIGS. 1 to 4 is completed.

As described above, according to the embodiment, in surface regions of the semiconductor substrate, at the front surface thereof, instead of portions of the $n^+$-type source regions, the low-concentration regions of an $n^-$-type and having an impurity concentration lower than that of the $n^+$-type source regions, or the low-concentration regions of the $p^-$-type and having an impurity concentration lower than the p-type impurity concentration of the channel portions of the p-type base regions are provided. The pinch-off voltage of the channel may be reduced by the low-concentration regions. As a result, that time that elapses until the drain-source current (short circuit current) that flows during a load short-circuit or during an arm short-circuit is blocked may be shortened and the saturation current value may be reduced, whereby the short-circuit withstand capability may be improved.

Further, according to the embodiment, portions of the surface regions of the epitaxial layer of the $n^-$-type or the $p^-$-type constituting the low-concentration regions are left as the conductivity type (the $n^-$-type or the $p^-$-type) of the epitaxial layer and are free of the $n^+$-type source regions and the $p^{++}$-type contact regions, whereby the low-concentration regions of the $n^-$-type or the $p^-$-type may be formed. Thus, ion-implantation mask patterns, respectively, for the $n^+$-type source regions and the $p^{++}$-type contact regions may be suitably changed, whereby the low-concentration regions may be formed using a method of manufacturing the conventional semiconductor device (refer to FIGS. 6 and 7). Thus, the short-circuit withstand capability may be improved without increasing the number of processes.

Further, according to the embodiment, in surface regions of the semiconductor substrate, at the front surface thereof, the low-concentration regions are provided instead of a portion of the n$^+$-type source regions, whereby the area of ohmic contact of the source electrode is reduced by the area of contact between the source electrode and the low-concentration regions and the on-resistance per unit area increases, and the effect of reducing the saturation current value increases. As a result, the tradeoff relationship between reducing the on-resistance and reducing the saturation current value may be improved. Further, impurity concentration of the low-concentration regions is set to be low within the range described above, whereby the electrical characteristics of the MOSFET are not adversely affected by the increased on-resistance resulting from provision of the low-concentration regions.

Further, according to the embodiment, in the low-concentration regions of the n$^-$-type, the n-type impurity concentration of the surface regions thereof (portions thereof at the front surface of the semiconductor substrate) is set to be relatively high or in the low-concentration regions of the p$^-$-type, the p-type impurity concentration of the surface region thereof is set to be relatively low. As a result, the resistance of the surface regions of the low-concentration regions is relatively low when the MOSFET is on and the drift current flows into the relatively low-resistance surface regions of the low-concentration regions, from the n$^+$-type source regions. As a result, the area of the current path of the drift current that flows from the semiconductor substrate into the source electrode increases by the area of the joined surfaces of the semiconductor substrate and the source electrode, whereby the on-resistance may be reduced.

Further, according to the embodiment, the ion-implantation mask patterns, respectively, for forming the n$^+$-type source regions and the p$^{++}$-type contact regions are suitably changed, thereby, enabling formation of the low-concentration regions, whereby two-dimensional (the first direction and the second direction) conditions are designed, enabling formation of the low-concentration regions. As a result, consideration of a combination of multiple design conditions including three-dimensional (the first direction, the second direction, and the depth direction) conditions such as ion implantation conditions of the channel portions, the thickness of the channel portions of the p-type base region, the thickness of the epitaxial layer constituting the p-type base region, etc. is unnecessary. Thus, a semiconductor device having high short-circuit withstand capability may be manufactured at a low cost.

Figure 5:
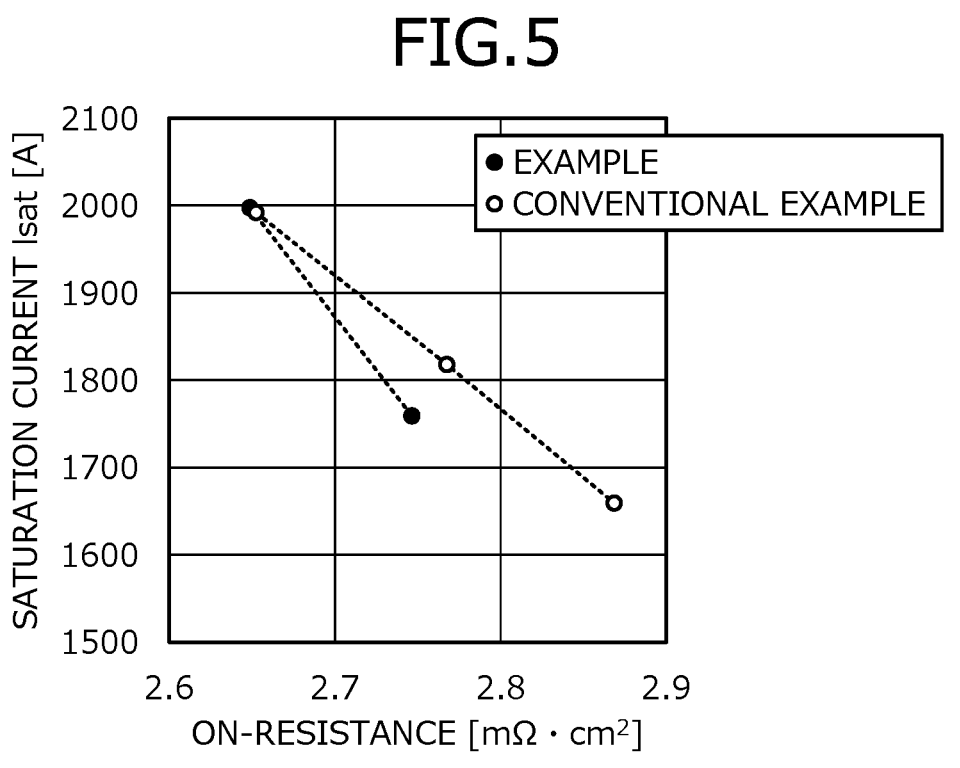

A relationship between on-resistance and the saturation current value of the semiconductor device 10 according to the embodiment described above (refer to FIGS. 1 to 4: hereinafter, "example") was verified. FIG. 5 is a characteristics diagram depicting results of simulation of the relationship between the on-resistance per unit area and the saturation current value of the example. In FIG. 5, a horizontal axis indicates the on-resistance per unit area [m$\Omega \cdot$cm$^2$] and a vertical axis indicates the saturation value (the saturation current value) [A] of a saturation current Isat.

Results of simulation of the saturation current value with respect to the on-resistance per unit area, for both the example and a conventional example (the conventional semiconductor device 110 depicted in FIGS. 6 and 7) are depicted in FIG. 5. The conventional example differs from the example in that the low-concentration regions 5 are not provided. In both the example and the conventional example, the on-resistance per unit area was changed by changing the channel resistance value by changing the impurity concentrations of the channel portions 3a, 103a of the p-type base regions 3, 103, respectively.

From the results depicted in FIG. 5, it was confirmed that in the example, the saturation current value could be reduced as compared to the conventional example for the same on-resistance per unit area. In other words, as compared to the conventional example, the example could improve the tradeoff relationship between reducing the on-resistance and reducing the saturation current value. Further, in both the example and the conventional example, even within a non-depicted on-resistance range, there is a proportional relationship in which the saturation current value decreases by a predetermined ratio as the on-resistance increases.

In the foregoing, the present invention is not limited to the embodiments described above and various modifications not departing from the spirit of the invention are possible. For example, the present invention is further applicable to semiconductor devices containing silicon (Si) as a semiconductor material. Further, while description is given assuming the first conductivity type to be an n-type and the second conductivity type to be a p-type, the present invention is similarly implemented when the first conductivity type is a p-type and the second conductivity type is an n-type.

According to the invention described above, the pinch-off voltage of the channel may be reduced by the fourth semiconductor regions, whereby the time that elapses until drain-source current (short circuit current) that flows during a load short-circuit or during an arm short-circuit is blocked may be shortened and the saturation current value may be reduced. Further, according to the invention described above, the ion-implantation mask patterns, respectively, for the third semiconductor regions and the fifth semiconductor regions are suitably changed, whereby the fourth semiconductor regions may be formed using a method of manufacturing the conventional semiconductor device (refer to FIGS. 6 and 7).

The semiconductor device according to the present invention achieves an effect in that short-circuit withstand capability may be improved without increasing the number of processes of manufacture.

As described above, the semiconductor device according to the present invention is useful for power semiconductor devices used in power converting equipment and power source devices such as those of various types of industrial machines, etc., and is particularly suitable for MOSFETs containing silicon carbide as a semiconductor material.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a first semiconductor region of a first conductivity type, provided in a semiconductor substrate that has a first main surface and a second main surface opposite to each other in a depth direction thereof;
   a second semiconductor region of a second conductivity type, provided between the first main surface of the semiconductor substrate and the first semiconductor region;
   a trench penetrating through the second semiconductor region, from the first main surface of the semiconductor substrate in the depth direction, and terminating in the first semiconductor region;

a gate electrode provided in the trench, via a gate insulating film;

a plurality of third semiconductor regions of the first conductivity type, selectively provided between the first main surface of the semiconductor substrate and the second semiconductor region, the plurality of third semiconductor regions each being in contact with the gate insulating film at a corresponding one of sidewalls of the trench;

a plurality of fourth semiconductor regions, selectively provided between the first main surface of the semiconductor substrate and the second semiconductor region, the plurality of fourth semiconductor regions each being in contact with the gate insulating film at a corresponding one of the sidewalls of the trench;

a plurality of fifth semiconductor regions of the second conductivity type, selectively provided between the first main surface of the semiconductor substrate and the second semiconductor region, apart from the trench, the plurality of fifth semiconductor regions having an impurity concentration higher than an impurity concentration of the second semiconductor region;

a first electrode in contact with the plurality of third semiconductor regions, the plurality of fourth semiconductor regions, and the plurality of fifth semiconductor regions; and a second electrode in contact with a second main surface of the semiconductor substrate, wherein the plurality of fourth semiconductor regions is a plurality of first-conductivity-type regions having an impurity concentration of the first conductivity type lower than an impurity concentration of the plurality of third semiconductor regions or is a plurality of second-conductivity-type regions having an impurity concentration of the second conductivity type lower than the impurity concentration of the second semiconductor region at a portion thereof that is in a vicinity of and along the sidewalls of the trench.

2. The semiconductor device according to claim 1, wherein the plurality of fourth semiconductor regions is periodically disposed along the trench, in a direction parallel to the first main surface of the semiconductor substrate.

3. The semiconductor device according to claim 1, wherein the plurality of fourth semiconductor regions is disposed between the trench and the plurality of fifth semiconductor regions.

4. The semiconductor device according to claim 1, wherein the impurity concentration of the plurality of fourth semiconductor regions is in a range of $1\times10^{14}/cm^3$ to $1\times10^{18}/cm^3$.

5. The semiconductor device according to claim 1, wherein the plurality of fourth semiconductor regions:

is the plurality of first-conductivity-type regions, and has a first-conductivity-type impurity concentration distribution in which the impurity concentration is greatest at the first main surface of the semiconductor substrate and continuously decreases with increasing proximity to the second main surface of the semiconductor substrate.

6. The semiconductor device according to claim 1, wherein the plurality of fourth semiconductor regions:

is the plurality of second-conductivity-type regions, and has a second-conductivity-type impurity concentration distribution in which the impurity concentration is lowest at the first main surface of the semiconductor substrate and continuously increases with increasing proximity to the second main surface of the semiconductor substrate.

7. The semiconductor device according to claim 1, wherein at the first main surface of the semiconductor substrate, in a direction that the trench extends, a length of each of the plurality of fourth semiconductor regions at a portion thereof that is in contact with the gate insulating film at a corresponding one of the sidewalls of the trench is in a range of 1.0 μm to 4.0 μm.

8. The semiconductor device according to claim 1, wherein the trench has a stripe-shape extending in a first direction parallel to the first main surface of the semiconductor substrate, the plurality of third semiconductor regions and the plurality of fourth semiconductor regions are disposed repeatedly alternating with one another in the first direction, and the plurality of third semiconductor regions and the plurality of fifth semiconductor regions are disposed repeatedly alternating with one another in the first direction.

9. The semiconductor device according to claim 8, wherein a width of each of the plurality of fourth semiconductor regions in the first direction is not more than a width of each of the plurality of fifth semiconductor regions in the first direction.

10. The semiconductor device according to claim 1, wherein the semiconductor substrate contains silicon carbide.

* * * * *